United States Patent
Huang

(10) Patent No.: US 6,999,518 B1
(45) Date of Patent: Feb. 14, 2006

(54) RECEIVER AND TRANSMISSION IN A TRANSMISSION SYSTEM

(75) Inventor: Hong-Yi Huang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 961 days.

(21) Appl. No.: 09/708,435

(22) Filed: Nov. 9, 2000

(30) Foreign Application Priority Data

May 5, 2000 (TW) .............................. 89108589 A

(51) Int. Cl.
*H04L 27/00* (2006.01)
(52) U.S. Cl. ...................... 375/259; 375/219; 375/295; 375/316; 327/208; 326/83
(58) Field of Classification Search ................ 375/219, 375/220, 257, 259, 260, 295, 316, 318; 326/21, 326/30, 62, 83, 86; 327/208; 333/33, 24 R
See application file for complete search history.

(56) References Cited

U.S. PATENT DOCUMENTS

| | | | |
|---|---|---|---|
| 3,879,621 A | | 4/1975 | Cavaliere et al. |
| 4,517,533 A | * | 5/1985 | Bretl ...................... 331/116 R |
| 4,843,264 A | | 6/1989 | Galbraith |
| 4,910,713 A | | 3/1990 | Madden et al. |
| 5,079,745 A | | 1/1992 | Ito et al. |
| 5,253,137 A | | 10/1993 | Seevinck |
| 5,495,186 A | * | 2/1996 | Kanazawa et al. ............. 326/83 |
| 5,534,800 A | | 7/1996 | Hiraki et al. |
| 5,668,765 A | | 9/1997 | Ang |
| 5,838,722 A | * | 11/1998 | Consi ........................ 375/219 |
| 6,037,891 A | * | 3/2000 | Griph ......................... 341/161 |
| 6,154,069 A | * | 11/2000 | Ebihara ...................... 327/112 |
| 6,459,323 B2 | * | 10/2002 | Birkeli ........................ 327/333 |
| 6,483,879 B1 | * | 11/2002 | Gasparik ..................... 375/257 |
| 2001/0022529 A1 | * | 9/2001 | Birkell ........................ 327/559 |

FOREIGN PATENT DOCUMENTS

| | | |
|---|---|---|
| GB | 2 306 027 A | 4/1997 |
| JP | 05-183470 A | 7/1993 |
| JP | 10-320089 A | 12/1998 |

\* cited by examiner

*Primary Examiner*—Jean B. Corrielus
(74) *Attorney, Agent, or Firm*—Birch, Stewart, Kolasch & Birch, LLP

(57) ABSTRACT

A transmission system structure including a signal receiver and a signal transmitter. The signal transmitter that transmits a differential input signal pair to the transmission line is mainly used for pre-charging the input terminal of the signal receiver to a predetermined voltage level. The differential signal pair is transmitted to the transmission line after pre-charging. The signal receiver includes a positive feedback differential amplifier, a coupling circuit and pre-charging device. The pre-charger can pre-charge the differential input terminal of the positive feedback differential amplifier to the predetermined voltage level. During evaluation, the coupling circuit couples from the input terminal to the differential input terminal. When there is a sufficient voltage difference on the differential input terminals, the positive feedback differential amplifier is turned on to amplify the entered differential input signal and outputs it to the differential output terminal.

24 Claims, 11 Drawing Sheets

RECEIVER AND TRANSMISSION IN A TRANSMISSION SYSTEM

BACKGROUND OF THE INVENTION

1. Field of the Invention

The Invention relates to a semiconductor circuit, more particularly to the transmitting and reading of signals over long distances or heavy load transmission. It is suitable for the driver and sense amplifier or logic circuit etc. of a normal semiconductor memory circuit and can achieve the advantages of high speed and low power transmission.

2. Description of the Prior Art

The development of semiconductor manufacturing processes has lead to decreasing device size. This trend decreases the gate delay of the integrated circuit. On the other hand, more and more devices are integrated in the same chip, for example the system-on-a-chip (SOC). This trend increases the length of the interconnection between devices become longer as the chip becomes larger. This results in longer delay for interconnections. Therefore, how to maintain the characteristic of high-speed transmission in large integrated circuits is an important field of study. Furthermore, the increasing number of transistors and devices in large integrated circuits makes the problem of power consumption a serious issue.

The invention proposes solutions to the problems of the transmission speed and power consumption in integrated circuits. More particularly, it targets the transmission conditions of the transmitter and the receiver of a transmitting structure. The transmitter is the source terminal of logic signals and the receiver is the destination terminal of logic signals. In the following description, the sense amplifier is given as the main example of the receiver. For example, the sense amplifier in the memory integrated circuit is a device used for receiving small signals from bit lines; and the transmitter is the signal driver. There are many patent publications (for example, U.S. Pat. Nos. 3,879,621; 4,843,264; 4,910,713; 5,079,745; 5,253,137; 5,534,800; 5,668,765) and technical documents discussing this technology, so it will not be described in detail here.

SUMMARY OF THE INVENTION

The object of the invention is to provide a signal transmission structure in which the signal transmitter and receiver used not only achieve high-speed transmission but also reduce the power consumption required during transmission.

According to the above object, the invention provides a signal receiver which can receive a pair of differential signals by using an external differential input terminal. The signal receiver includes a positive feedback differential amplifier, a coupling circuit and a pre-charger. The positive feedback amplifier has a differential input terminal and a differential output terminal. The coupling circuit couples between the external differential input terminal, the differential input terminal and the differential output terminal, and is used to couple the differential input signal pair of the external differential input terminal to the differential input terminal. The pre-charger is used to pre-charge the differential input terminal to a predetermined voltage. Before the first time point, the corresponding signal terminals between the differential input terminal and the external differential input terminal are coupled. After the first time point, the differential input signal pair enters into the differential input terminal of the positive feedback differential amplifier via the coupling circuit. At the second time point, a predetermined period after the first time point, the positive feedback differential amplifier is turned on to amplify the entered differential input signal pair and output it to the differential output terminal.

The coupling circuit is comprised of a first coupling circuit and a second coupling circuit. The first coupling circuit is comprised of a first transistor and a second transistor. The gates of the first transistor and the second transistor are coupled together and are connected to the first signal terminal of the differential output terminal. The source terminals of the first transistor and the second transistor are coupled and connected to the first signal terminal of the differential input terminal. The drain of the first transistor is the first signal terminal of the external differential input terminal. The second coupling circuit is comprised of a third transistor and a fourth transistor. The gates of the third transistor and the fourth transistor are coupled and connected to the second signal terminal of the differential output terminal; the sources of the third and fourth transistor are coupled and connected to the second signal terminal of the differential input terminal; and the drain of the third transistor is the second signal terminal of the external differential input terminal.

Furthermore, the first coupling circuit and the second coupling circuit can also be comprised of capacitors. For example, the first coupling circuit is comprised of a first capacitor of which one terminal is coupled to the first signal terminal of the external differential input terminal, and a fifth transistor of which the gate is connected to the first signal terminal of the differential output terminal and the drain is connected to the other terminal of the first capacitor and the first signal terminal of the differential output terminal. The second coupling circuit is comprised of a second capacitor of which one terminal is coupled to the second signal terminal of the external differential input terminal; and a sixth transistor of which the gate is connected to the second signal terminal of the differential output terminal and the drain is connected to the other terminal of the second capacitor and the second signal terminal of the differential input terminal.

In addition, the pre-charger can include a first local control transistor of which the gate connects a first control signal is used to pre-charge the first signal of the differential input terminal to the predetermined voltage before the first time point and is turned off after the first time point; and a second local control transistor of which the gate is connected to the first control signal is used to pre-charge the second signal terminal of the differential input terminal to the predetermined voltage before the first time point and is turned off after the first time point. Before the first time point, the external differential input terminal is pre-charged to the predetermined voltage; the positive feedback differential amplifier is controlled by a second control signal, which is used to define the second time point. Furthermore, the pre-charger can also include a third local control transistor of which the gate is connected to the second control signal, and the source and drain are connected to the first signal and second signal of the differential input terminal, respectively, said second control signal being used to define the second time point.

Furthermore, the present invention also provides a signal receiver which receives an independent input signal through an external input terminal, and includes a positive feedback differential amplifier, a coupling circuit and pre-charger. The positive feedback differential amplifier has a differential input terminal and a differential output terminal. The coupling circuit is coupled between the external input terminal, the differential input terminal and differential output terminal, and couples the independent input signal of the external input terminal to the differential input terminal. The pre-charger is used to pre-charge the differential input terminal to a predetermined voltage. Before the first time point, the corresponding signal terminal of the differential input terminal is coupled to the external input terminal; after the first time point, the independent input signal enters into the differential input terminal of the positive feedback differential amplifier via the coupling circuit; at a second time point, a predetermined period after the first time point, the positive feedback differential amplifier is turned on for amplifying the independent input signal and outputting it to the differential output terminal.

Furthermore, the present invention also provides the corresponding signal transmitter for transmitting a differential input signal pair to the transmission line via the external differential output terminal. The signal transmitter is comprised of a transistor control circuit controlled by a first control signal. The first control signal is used to define a first time point. Before the first time point, the transmission line is pre-charged to a predetermined voltage through the external differential output terminal; after the first time point, the differential input signal pair is equivalently transmitted to the transmission line.

The transistor control circuit can be coupled to the external differential output terminal by carrying out a static circuit, for example, a differential circuit, and is controlled by the first control signal. The differential circuit includes a dynamic load. The dynamic load is controlled by the first control signal and operates opposed to the differential circuit for pre-charging the transmission line to a predetermined voltage. In addition, the transistor control circuit can also include a differential circuit and is coupled to the external differential output terminal and controlled by the first control signal. The differential circuit includes a fixed load for pre-charging the transmission line to a predetermined voltage.

Furthermore, the transistor control circuit can be implemented by a dynamic circuit, including, for example, a first logic gate and a second logic gate. The first logic gate's input terminal is connected to the first control signal and the first signal of the differential input signal pair, and its output terminal is connected to the first signal terminal of the external differential output terminal, for pre-charging the corresponding transmission line to the predetermined voltage via the first signal terminal of the external differential output terminal before the first time point. After the first time point, the first signal of the differential input signal pair is equivalently sent to the corresponding transmission line. The second logic gate's input terminal is connected to the first control signal and the second signal of the differential input signal pair, and its output terminal is connected to the second signal terminal of the external differential output terminal, for pre-charging the transmission line to the predetermined voltage via the second signal terminal of the external differential output terminal before the first time point. After the first time point, the second signal of the differential input signal pair is equivalently sent to the corresponding transmission line. The first logic gate and the second logic gate can be NAND gates or NOR gates.

In addition, the transistor control circuit can equivalently cut off the transmitting path of the differential input signal pair to the transmission line within a predetermined period after the first time point to reduce the power consumption. For instance, it can include a first differential circuit, wherein its input terminal is connected to the first control signal and the external differential output terminal, and its output terminal generates a feedback signal pair; and a second differential circuit, wherein its input terminal is connected to the first control signal, the differential input signal pair and the feedback signal pair, and its output terminal is connected to the external differential input terminal. The transistor control circuit can also include a first logic gate, wherein its input terminal is connected to the first control signal, the first signal of the differential input signal pair and a first feedback signal, and its output terminal is connected to the first signal terminal of the external differential output terminal; a second logic gate, wherein its input terminal is connected to the first control signal, the second signal of the differential input signal pair and a second feedback signal, and its output signal is connected to the second signal terminal of the external differential output terminal; a third logic gate, wherein its input terminal is connected to the first control signal and the first signal terminal of the external differential output terminal, and its output generates the first feedback signal; and a fourth logic gate, wherein its input terminal is connected to the first control signal and the second signal terminal of external differential output terminal, and its output signal is connected to the second feedback signal.

According to the above, the present invention provides a signal transmitting structure which can be placed inside a chip and include a signal transmitter and a signal receiver connected by a transmission line. The signal transmitter sends a differential input signal pair to the transmission line through its external differential output terminal, the signal receiver receives the differential input signal pair through the external differential input terminal. The signal transmitter includes a transistor control circuit controlled by a first control signal. The first control signal defines the first time point for pre-charging the transmission line to a predetermined voltage via the external differential output terminal before the first time point, and equivalently sending the differential input signal pair to the transmission line after the first time point. The signal receiver is comprised of a positive feedback differential amplifier with a differential input terminal and a differential output terminal; a coupling circuit coupled between the external differential input terminal, the differential input terminal and the differential output terminal for coupling the differential input signal pair of the external differential input terminal to differential input terminal; and a pre-charger for pre-charging the differential input terminal to the predetermined voltage. Before the first time point, the corresponding signal terminals of the differential input terminal and external differential input terminal are coupled; after the first time point, the differential input signal pair enters into the differential input terminal of the positive feedback differential amplifier via the coupling circuit, and at the second time point, a predetermined period after the first time point, the positive feedback differential amplifier is turned on for amplifying the entered differential input signal pair and outputting it to the differential output terminal.

BRIEF DESCRIPTION OF THE DRAWINGS

The following detailed description, given by way of example and not intended to limit the invention solely to the embodiments described herein, will best be understood in conjunction with the accompanying drawings, in which:

FIG. 7b is a diagram of the signal waveforms illustrated in FIG. 7a;

FIG. 8b is a diagram of the signal waveforms illustrated in FIG. 8a;

FIG. 9b is a diagram of the signal waveforms illustrated in FIG. 9a;

FIG. 10b is a diagram of the signal waveforms illustrated in FIG. 10a;

FIG. 11b is a diagram of the signal waveforms illustrated in FIG. 11a.

DETAILED DESCRIPTION OF THE INVENTION

The present invention discloses a new signal transmitting structure, wherein the signal-transmitting terminal transmits the signal to be transmitted to the signal receiver at high speed, and the power consumption is reduced during the transmission. In the following embodiments, the types of signal driver and sense amplifier are described. However, it should be apparent to the skilled in the art that the same principle can be applied to other transmitting environments without departing from the scope of the present invention.

FIRST EMBODIMENT

Figure 1:
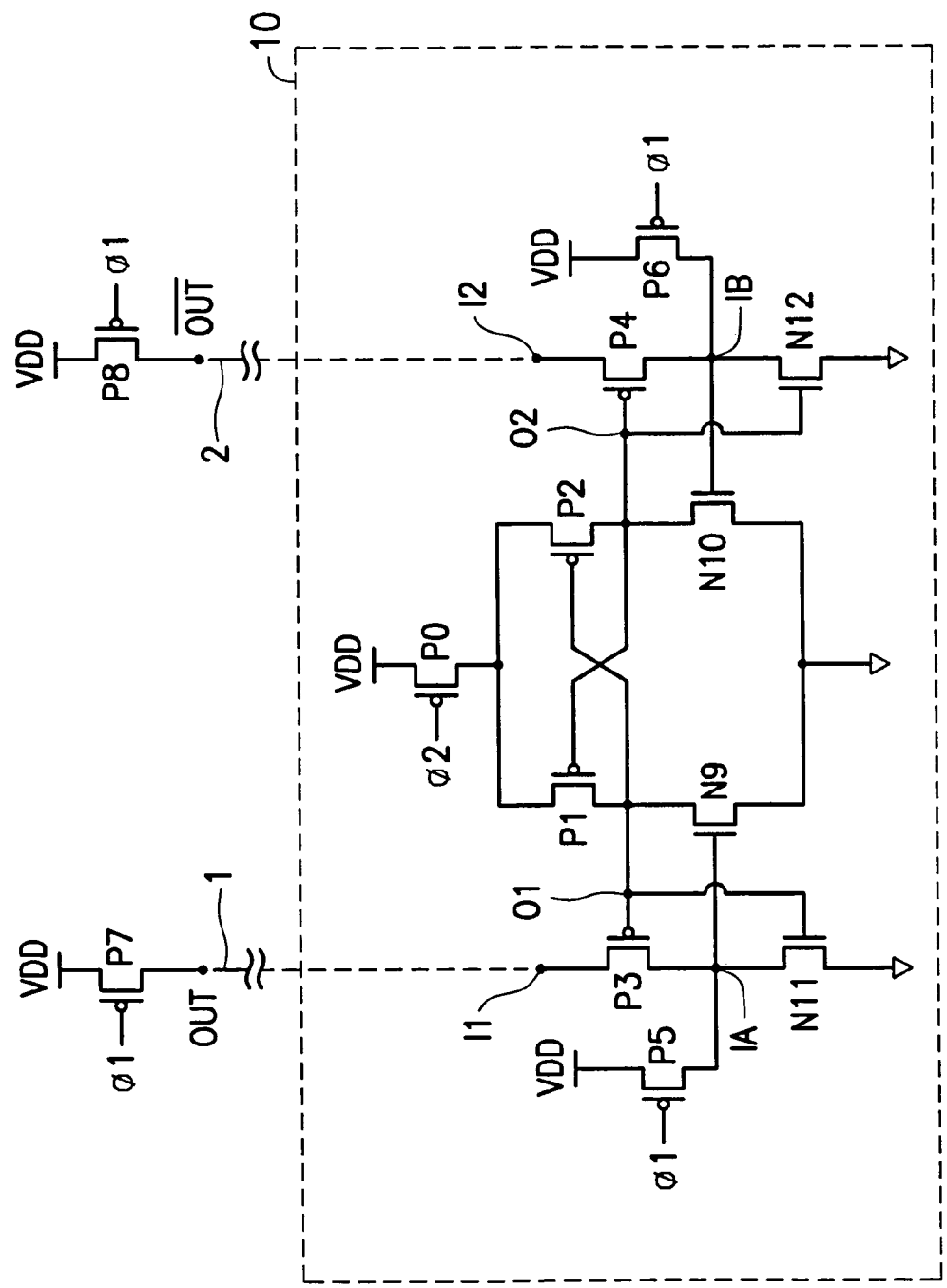
FIG. 1 is a circuit diagram of a signal receiver in accordance with the first embodiment of the present invention.

FIG. 1 illustrates the circuit diagram of the signal transmitting structure according to the first embodiment of the present invention. Numeral 10 represents the signal receiver of the signal transmitting structure, i.e., the sense amplifier. In short, transistor P7 and transistor P8 are signal transmitters of the signal transmitting structure in a simple view. The signal driver, the detailed circuit will be described later.

Transistor P7 and transistor P8 representing the signal transmitters transmit a differential signal pair to signal receiver 10 via transmission line 1 and 2. In this embodiment, if the lengths of transmission line 1 and transmission line 2 are very long, thereby increasing the RC delay, the speed at which the transmitter transmits the signal to the receiver in the conventional environment becomes very slow. In the following description, in order to explain more clearly the characteristic of the transmission line 1 and transmission line 2, the output terminals of signal transmitter (for example, the transistor P7 and P8) are labeled OUT and $\overline{OUT}$, and the input terminals of the signal receiver 10 are labeled 11 and 12 respectively.

In the signal receiver 10, PMOS transistors P0, P1 and P2 and NMOS transistors N9 and N10 comprise a positive feedback differential amplifier. The gate of the transistor P0 is connected to the control signal Ø2; transistors P1 and P2 are interconnected, resulting in positive feedback; the drains of the transistors N9 and N10 are connected to transistors P1 and P2, and act as differential output terminals 01 and 02; and the gates of the transistors N9 and N10 act as differential input terminals IA and IB of the positive feedback differential amplifier.

Furthermore, PMOS transistor P3 and NMOS transistor N11 comprise a coupling circuit. The gates of transistors P3 and N11 are connected, and are connected to differential input terminal IA. The source of the transistor P3 acts as input terminal I1. The gates of the transistors P3 and N11 are connected, and are connected to the differential output terminal 01. Similarly, PMOS transistor P4 and NMOS transistor N12 comprise another coupling circuit. The drains of the transistors P4 and N12 are connected, and are connected to the differential input terminal IB. The source of the transistor P4 acts as input terminal 12. The gates of the transistors P4 and N12 are connected, and are connected to the differential output terminal 02.

Furthermore, PMOS transistors P5 and P6 act as a pre-charging circuit, pre-charging the differential input terminals IA and IB respectively. The gates of the transistors P5 and P6 are connected to the control signal 01. When the control signal Ø1 is at logic "0", transistors P5 and P6 conduct, thereby pre-charging the differential input terminals IA and IB to VDD. On the other hand, the transistors P7 and P8 acted as signal transmitter are also controlled by the control signal Ø1. When the control signal is at logic "0", transistors P7 and P8 conduct, thereby pre-charging input terminals OUT and $\overline{OUT}$ to VDD.

Figure 3:
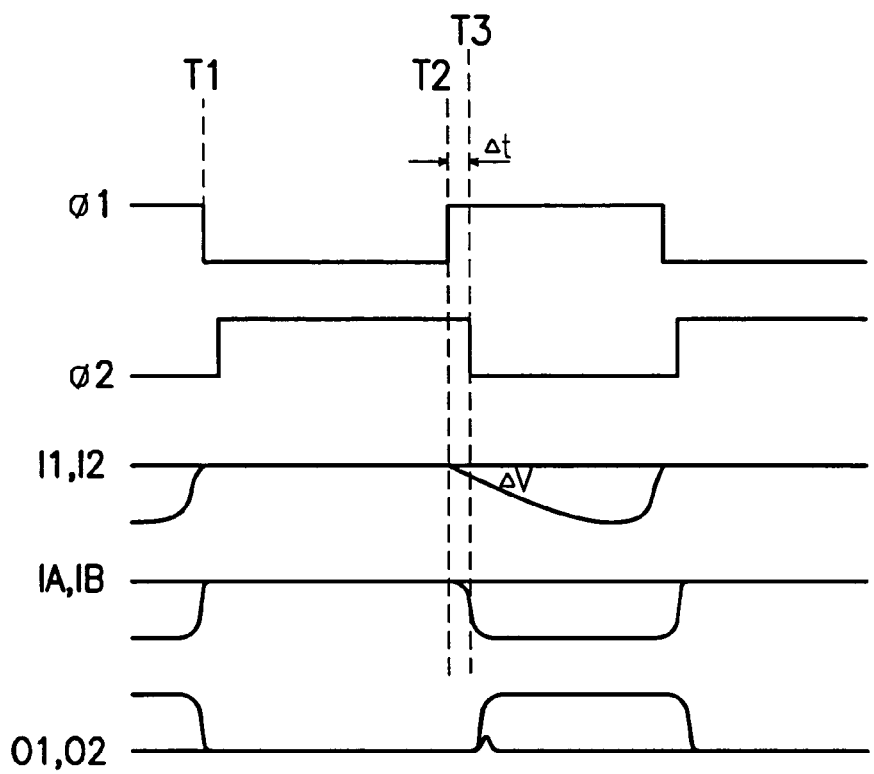
FIG. 3 is a diagram of the signal waveforms illustrated in FIG. 1 in the first embodiment of the present invention.

The signal transmission structure includes control signal Ø1 and Ø2, the signal waveforms of which are shown in FIG. 3, wherein the rising edge of the control signal Ø1 and the falling edge of the control signal Ø2 are spaced apart by time Δt.

FIG. 3 is the schematic diagram of the signal waveforms of the signal transmitting structure according to the first embodiment of the present invention, which includes the control signal Ø1 and the control signal Ø2, input terminals I1/I2, differential input terminals IA/IB and differential input terminals 01/02. The operation of the signal transmitting structure of this embodiment is described in detail in conjunction with FIG. 1 and FIG. 3.

First, at the first time point, the control signal 01 becomes logic "0", and the control signal Ø2 becomes logic "1", the transistors P7 and P8 (signal transmitter) and transistors P5 and P6 (pre-charging circuit) conduct. Therefore, input terminals I1/I2 will be pre-charged to VDD via the transistors P7 and P8 and transmission lines 1 and 2. Similarly, the differential input terminals IA/IB can also be pre-charged to VDD via the transistors P5 and P6. On the other hand, since the control signal Ø2 is at logic "1", transistor P0 is turned off, i.e., the positive feedback differential amplifier (including P0, P1, P2, N9, N10) is disabled. However, because the differential input terminals IA/IB are pre-charged to VDD, transistor N9 and N10 will conduct. In other words, the transistors N9 and N10 in conducting state will construct the path to differential output terminals O1/O2 for ground discharging, so the differential input terminals O1/O2 will discharge to logic "0". At this point, transistors P3 and P4 in coupling path will conduct, enabling the input terminals I1/I2 and differential input terminals O1/O2 to become coupled and conduct. However, the transistors N11 and N12 are turned off; therefore, there is no DC current. Furthermore, in the process of pre-charging, since transistors P3 and P4 conduct, the input terminals I1/I2 and the differential input terminals IA/IB become coupled together. However, since the transistors N11 and N12 are turned off, the complete pre-charging process does not include any DC current, thereby reducing the power consumption.

Next, at the time point T2 (the first time point), the control signal becomes logic "1"; therefore, transistors P5–P8 are turned off. The output terminals OUT and OUT of the signal transmitter start to send signals. On the other hand, the input terminals I1/I2 of the signal receiver 10 start to evaluate. Since the transmitted signal is a differential signal, it is at logic "1" at one terminal and logic "o" at the other terminal. However, due to the length of the transmission lines 1 and 2, the change of the logic signal is slow. Given the input terminals I1/I2, it must be at logic "1" (the pre-charging voltage at one end) and falling gradually to logic "0". On the input terminals I1/I2, a predetermined time (i.e., Δt in this embodiment) must pass to receive the differential signal pair with a voltage difference ΔV. Meanwhile, the differential signal pair with voltage difference ΔV at the input terminals will be coupled to the differential input terminals (IA/IB) via transistors P3 and P4. Next, at the time point T3 (the second time point), the control signal Ø2 becomes logic "0", so the transistor P0 conducts, and the positive feedback differential amplifier is enabled. Since there is voltage difference ΔV on the differential input terminals IA/IB, the positive feedback differential amplifier will amplify this voltage difference ΔV, i.e. pull the differential output terminals O1/O2 to VDD or GND. Meanwhile, the changed differential output terminals O1/O2 level will make the differential input terminals IA/IB with only voltage difference ΔV quickly become the logic signal with normal level, thereby the transmitted signal pair can be successively received.

This transmission operation will be explained by an actual example. Assume before the time point T2, input terminals I1/I2 and differential input terminals IA/IB are pre-charged to VDD, i.e. system high voltage. At time point T3, when the differential signal results in a voltage difference ΔV on the input terminals I1/I2 in Δt, assume the transmitted signal via the transmission line 1 is logic "1", and the transmitted signal via the transmission line 2 is logic "0", thereby maintaining the original pre-charge voltage VDD on the input terminal I1, and VDD-ΔV on the input terminal I2. Similarly, the voltage of the input terminal I1 will be coupled to the differential input terminal IA, and the voltage of the input terminal I2 will be coupled to differential input terminal IB. After the time point T3, the positive feedback differential amplifier is enabled, making the differential output terminal O1 remain at the logic "0" in pre-charging period (i.e., GND), while the differential output terminal O2 needs to be raised to logic "1" (i.e., VDD). For differential output terminal O1, since it remains at logic "0", the transistor N11 will not conduct. At the same time, the corresponding differential input terminal IA still remains at the original pre-charge voltage VDD, i.e., logic "1". On the other hand, since differential input terminal O2 needs to be raised to logic "1", when its voltage rises sufficiently to conduct transistor N12, the transistor N12 will construct the discharge path of the differential input terminal IB, making the differential input terminal IB soon becomes logic "0". Affected by the operation of the positive feedback and differential input terminal becoming logic "0", the differential output terminal O2 can achieve the normal level of logic "1" quickly in this embodiment. To this end, the operation of transmission evaluation is completed. It should be understood that the coupled circuit transistors P3 and N11 on the input terminal I1. Since the differential input terminal O1 still remains at logic "0", the transistor P3 will conduct and the transistor N11 will be turned off. On the other hand, the coupled circuit transistors P4 and N12 on the input terminal I2. Since the differential output terminal O2 is raised to logic "1", transistor p4 is turned off, isolating the input terminal I2 and differential input terminal IB, and transistor N12 will conduct, making the differential input terminal IB discharge to GND quickly.

The signal transmitting structure of the embodiment has many advantages. First, the transistors N11 and N12 of the positive feedback differential amplifier and the ground terminal are not connected in series. Thus, the equivalent pull down transistor is small, and it can detect quickly the small voltage difference of the differential input terminals IA and IB and convert it to the current difference. Furthermore, differential output terminals O1 and O2 and differential input terminals I1 and I2 are not connected. In other words, only a tiny voltage difference is needed on the differential input terminals I1 and I2 to generate a receiving differential signal of full amplitude on the differential output terminals O1 and O2. In addition, input terminals I1 and I2 and differential input terminals IA and IB are isolated by transistors; therefore, there is no DC current, and in the process of positive feedback the load of differential input terminals IA and IB can be reduced, and the input terminals IA or IB which are pre-charged to VDD can be quickly pulled down to 0V. The most important advantage is that it only needs a very small voltage difference to recover to the required receiving transmitting signal. In addition, there is no DC current in this process, thereby reducing the power consumption.

Figure 2:
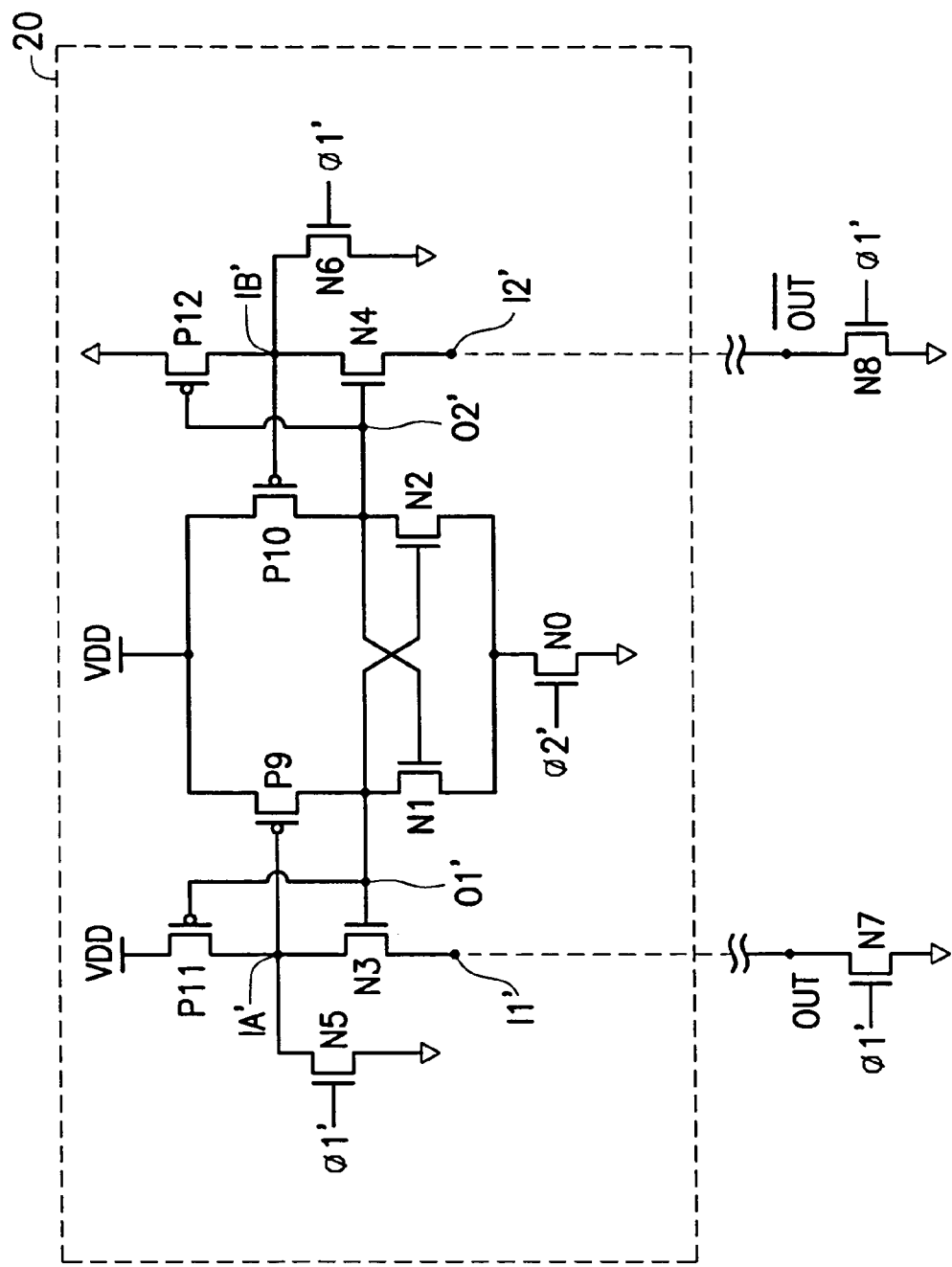
FIG. 2 is a circuit diagram of a signal receiver complementary to that in FIG. 1 in accordance with the first embodiment of the present invention.

FIG. 2 shows another circuit diagram of the signal transmitting structure according to the first embodiment of the present invention. The basic structure is the same as that of FIG. 1, except that the transistor used and polarity arrangement are complementary. In the signal receiver 20, NMOS transistors N0, N1 and N2 and PMOS transistors P9 and P10 comprise a positive feedback differential amplifier. The gate of transistor N0 is connected to the control signal Ø2'; transistors N1 and N2 are interconnected, resulting in positive feedback operation; the drains of the transistor P9 and P10 are connected to the transistors N1 and N2 below, to act as differential output terminals O1' and O2'; the gates of the transistors P9 and P10 act as the differential input terminals IA' and IB' of the positive feedback differential amplifier. NMOS transistor N3 and PMOS transistor P11 comprise a coupling circuit. The drains of the transistors N3 and P11 are connected, and are connected to the differential input terminal IA'; the source of the transistor N3 becomes input terminal I1'; the gates of transistors N3 and P11 are connected and are connected to the differential output terminal 01'. The NMOS transistor N4 and PMOS transistor P12 also comprise another coupling circuit. The drains of NMOS transistors N4 and P12 are connected and are connected to the differential input terminal IB'; the source of the transistor N4 acts as input terminal I2'; and the gates of transistors N4 and P12 are connected and are connected to differential output terminal 02'. Furthermore, the NMOS transistors N5 and N6 act as pre-charging circuit, pre-charging differential input terminals IA' and IB'. The gates of transistors N5 and N6 are connected to the control signal Ø1', and the transistors N7 and N8 acting as signal transmitter are also controlled by the control signal Ø1'.

Figure 4:
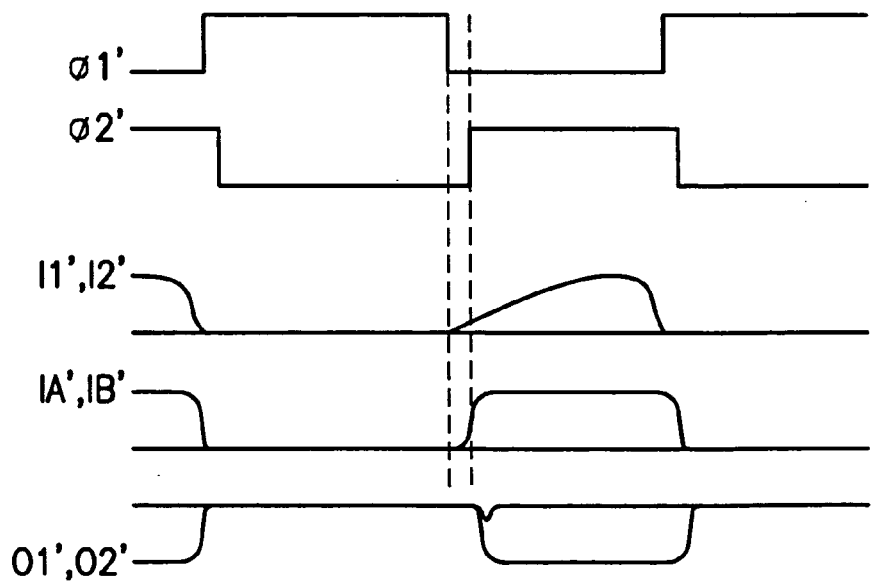
FIG. 4 is a diagram of the signal waveforms illustrated in FIG. 2 in the first embodiment of the present invention.

FIG. 4 shows the schematic diagram of the signal waveforms in the signal transmitting structure, the waveforms are basically the same as those of FIG. 3, the only difference being the signal polarity. Therefore, the same principles of operation described above apply and will not be described again here. However, it should be noted that pre-charging voltage of FIG. 1 is VDD, i.e., logic "1", and the pre-charging voltage of FIG. 3 is GND (0V), i.e., logic "0". Since the pre-charge voltage is related to the sent voltage value of the signal transmitter during the pre-charging period, the two voltages need to be distinguished when subsequently describing the signal transmitter.

Next, the signal transmitter circuit used in this embodiment will be described. In the FIG. 1 and FIG. 3, transistors P7/P8 and transistors N7/N8 only show the operation of the signal transmitter, and are not the real applied circuit. The signal transmitter of this embodiment needs to have the following operation: (1) during the pre-charging period (i.e., the control signal Ø1 of FIG. 1 is "0", and control signal Ø1 of FIG. 2 is "1"), the signal transmitter must send the corresponding pre-charge voltage to transmission line; in FIG. 1, the pre-charge voltage is VDD; In FIG. 2, the pre-charge voltage is GND (0V); (2) after the control signal Ø1 changes logic level, the signal transmitter must start sending the transmitting signal to be transmitted to the transmission line.

In this embodiment, the dynamic circuit and static circuit are described. First, the dynamic circuit is described. FIGS. 5a–5d show the schematic diagram of the circuit of the signal transmitter structure constructed by the dynamic circuit in this embodiment, wherein the signal transmitters of FIGS. 5b and 5c correspond to the signal receiver of FIG. 1, and the signal transmitters of FIGS. 5a and 5d correspond to the signal receiver of FIG. 2.

Figure 5A:
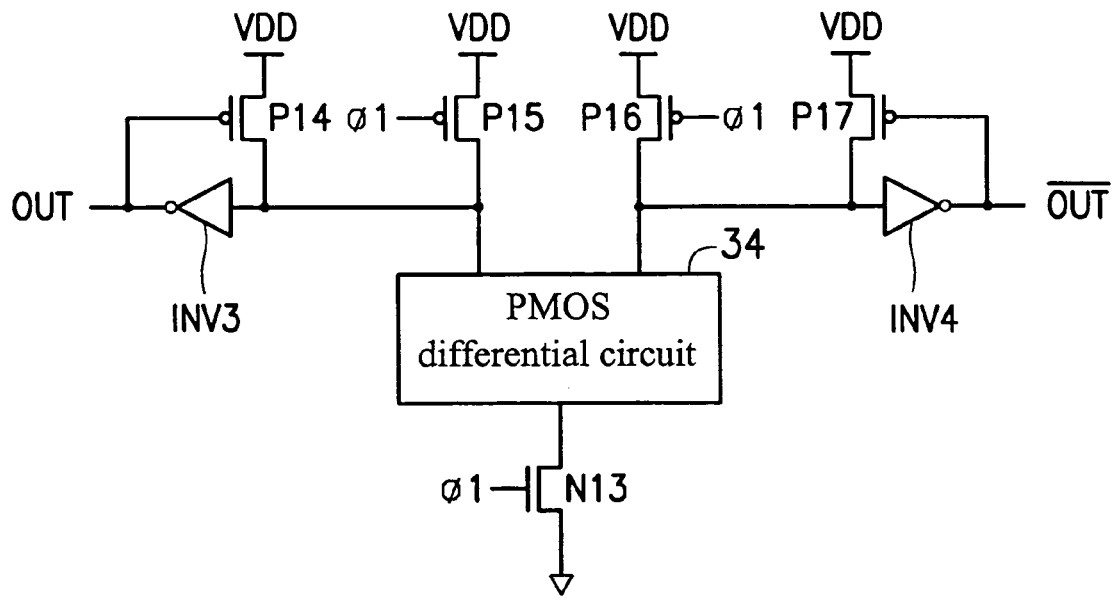
FIGS. 5a–5d are diagrams showing the structures of the signal transmitters constructed by dynamic circuitry in accordance with the first embodiment of the present invention.
Figure 5B:
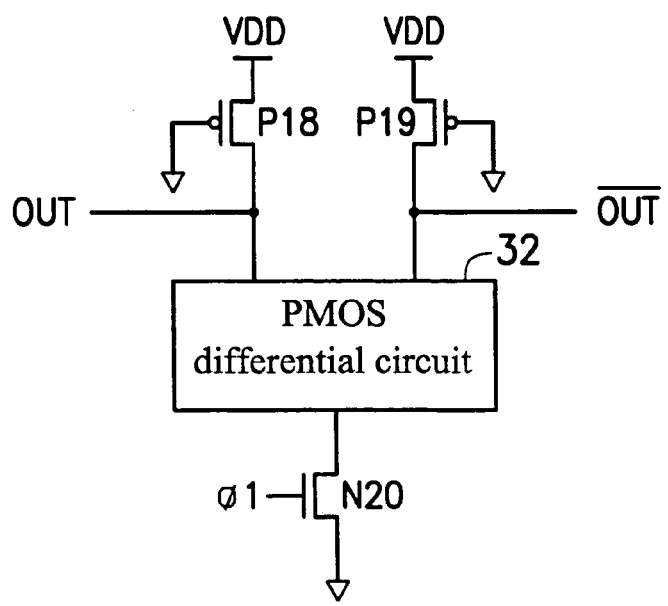
Figure 5C:
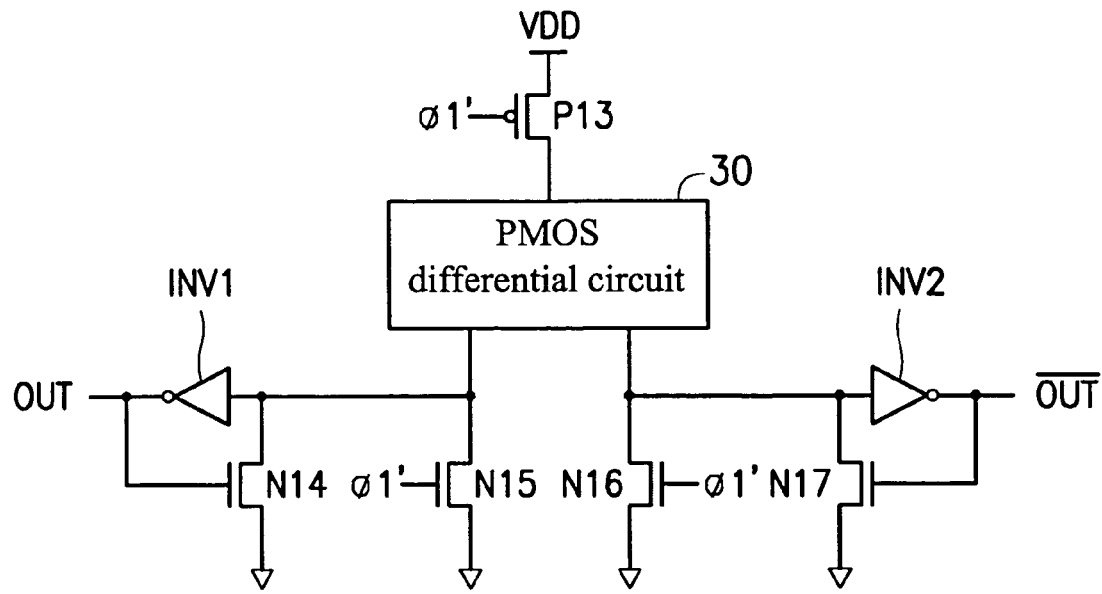

FIG. 5c is suitable for the signal transmitter of FIG. 1. The pre-charge voltage sent is at logic "1", and the controllable differential circuit is constructed by PMOS transistor P13 and PMOS differential circuit 30, wherein the gate of transistor P13 is connected to the control signal Ø1'. Furthermore, NMOS transistors N14–N17 and inverters INV1 and INV2 are variable load, the control of switch is controlled by control signal Ø1', and the timing pulse of control signal Ø1' is that in FIG. 3. When the control signal Ø1' is at logic 1, the output terminal OUT and $\overline{OUT}$ send out logic "1" for pre-charging. FIG. 5a is suitable for the signal transmitter of FIG. 2, the pre-charge voltage sent out is at logic "0". NMOS transistor 13 and NMOS differential circuit 34 comprise controllable differential circuit, PMOS transistors P14–P17 and inverters INV3 and INV4 are variable load. Transistor N13 and transistors P15 and P16 carry out the switch control under the control of the control signal Ø1, and the timing pulse of the control signal Ø1 is that in FIG. 4. When the control signal 1 is at logic "0", the terminal output OUT sends out logic "0" for pre-charging. In FIGS. 5a and 5c, by the control of the control signal Ø1' (Ø1) on different transistors, there is no DC current in operation.

Figure 5D:
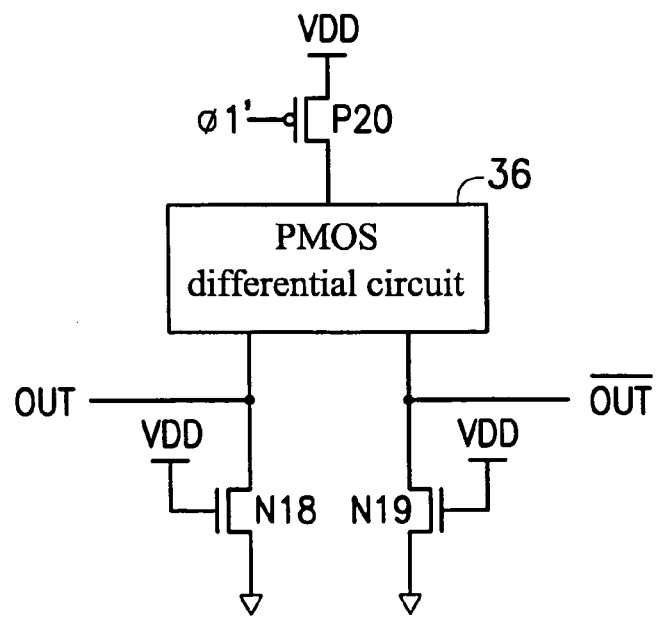

In contrast, fixed load is used in FIGS. 5b and 5d. The signal transmitter of FIG. 5b corresponds to the signal receiver of FIG. 1, wherein the NMOS transistor N20 and NMOS differential circuit 32 comprise a controllable differential circuit, and PMOS transistors P18 and P19 are fixed load. Therefore, when the control signal Ø1 is at logic "0", the transmission line connected to the output terminal OUT will be pre-charged to VDD, and when the control signal Ø1 becomes logic "1", the required transmitting differential signal will be sent out to output terminals OUT and $\overline{OUT}$. On the other hand, the signal transmitter of FIG. 5d corresponds to the signal receiver of FIG. 2, wherein PMOS transistor P20 and PMOS differential transistor 36 comprise the controllable differential circuit, and NMOS transistor N18 and N19 are fixed load. Therefore, when the control signal Ø1 is at logic "1", the transmission line voltage connected to output terminals OUT and $\overline{OUT}$ will be pulled down to 0V, and when the control signal Ø1 becomes logic "0", the required transmitting differential signal will be sent out on output terminals OUT and $\overline{OUT}$. The structure of signal transmitter of FIGS. 5b and 5d are simpler; however, there is DC current so the power consumption is worse.

Figure 6A:
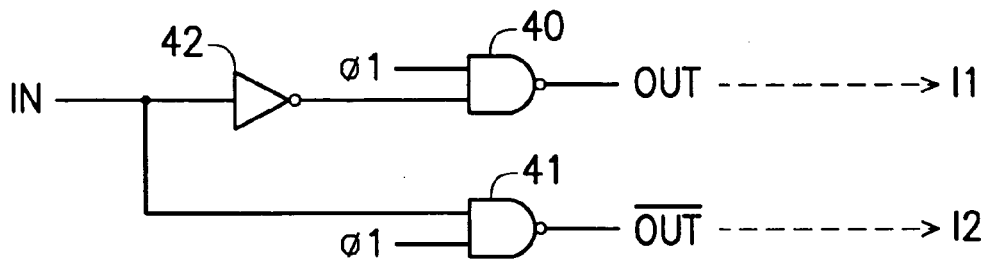
FIGS. 6a and 6b are diagrams showing the structures of the signal transmitters constructed by static circuitry in accordance with the first embodiment of the present invention.

In the above, the required signal transmitter is comprised of preset circuits, thereby preventing the output signal from floating and avoiding noise interference. However, by the same principle, a static circuit can be used to comprise the required signal transmitter. FIG. 6a shows the schematic diagram of the circuit of the signal transmitter constructed by a static circuit, corresponding to the signal receiver of FIG. 1, and FIG. 6c is the schematic diagram of the signal waveforms. In FIG. 6a, the signal to be transmitted IN generates the inverting signal through the inverter 42, thereby producing the differential signal pair to be transmitted. The signal transmitter is comprised of NAND gate 40 and NAND gate 41. The two input terminals of NAND gate 40 receive the control signals Ø1 and IN, respectively. In this embodiment, the output terminal of NAND gate 40 is connected to output terminal OUT, and is connected to the input terminal I1 via a very long transmission line. The two input terminals of NAND gate 41 receive control signal Ø1 and $\overline{IN}$ respectively. The output terminal of NAND gate 41 is connected to output terminal $\overline{OUT}$, and is connected to input terminal I2 via a very long transmission line.

Referring to FIG. 6c, the operation of the signal transmitter can be described as follows. When the control signal Ø1 is at logic "0", both NAND gate 40 and NAND gate 41 are at logic "1", i.e., signal receiver terminals I1 and I2 can be pre-charged to VDD through the transmission line. When the control signal Ø1 is at logic "1", the operations of NAND gate 40 and NAND gate 41 are equivalent to the inverter, so the signal on the output terminal OUT is IN, while on the output terminal $\overline{OUT}$ is $\overline{IN}$, thus sending the signal pair to be transmitted to input terminals I1 and I2.

Figure 6B:
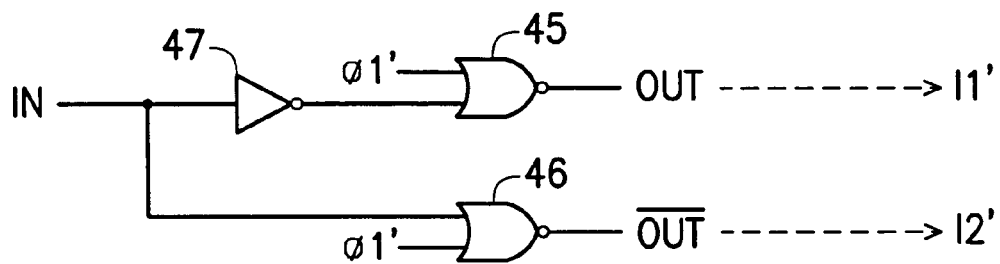
Figure 6C:
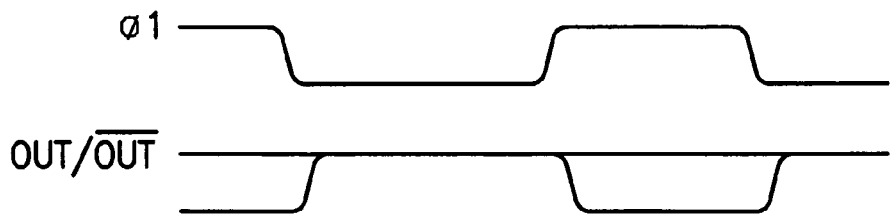
FIGS. 6c and 6d are diagrams of the signal waveforms illustrated in FIGS. 6a and 6b.
Figure 6D:
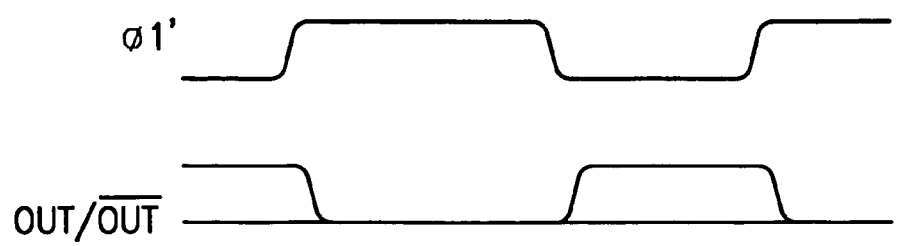

FIG. 6b shows another schematic diagram of the structure of the signal transmitter constructed by the static circuit in this embodiment used together with the corresponding signal receiver of FIG. 2. FIG. 6d is the schematic diagram of signal waveforms. As mentioned above, the difference between the two lies in the difference in the pre-charged voltage level. In FIG. 6b, the signal IN to be transmitted produces its inverting signal $\overline{IN}$ via the inverter 47. The signal transmitter is comprised of NOR gate 45 and NOR gate 46. The two input terminals of NOR gate 45 receive the control signal Ø1' and signal IN, respectively. The output terminal of NOR gate 45 is connected to output terminal $\overline{\text{OUT}}$, and is connected to input terminal I1' via transmission line. The two input terminals of NOR gate 46 receive control signal Ø1' and signal $\overline{\text{IN}}$ respectively. The output terminal of NOR gate 46 is connected to output terminal OUT, and is connected to input terminal I2 through the transmission line. Referring to FIG. 6d, when the control signal Ø1' is at logic "1", both NOR gate 45 and NOR gate 46 are at logic "0", i.e., the signal receiving terminal I1' and I2' can be pre-charged to 0V through the transmission line. When the control signal 1 is at logic "0", the operations of NOR gate 45 and NOR gate 46 are equivalent to the inverter, so the signal on the output terminal OUT is IN, on the output terminal $\overline{\text{OUT}}$ is $\overline{\text{IN}}$, i.e., the signal pair to be transmitted is sent to input terminal I1' and I2'.

It should be noted that, in the signal transmitter, before the pre-charge process is complete, the signal IN and $\overline{\text{IN}}$ to be transmitted must be in static state. In other words, in the process of evaluation, the signal to be transmitted cannot be varied. The above examples have been used in this embodiment for the signal transmitter. However, to the skilled in the art, there are other circuit types that can achieve the same object without departing from the scope of the present invention.

SECOND EMBODIMENT

In the first embodiment, the corresponding pre-charge transistors (for example, P5, P6 of FIG. 1 and N5, N6 of FIG. 2) area arranged on the differential input terminals IA/IB of the positive feedback differential amplifier for pre-charging the differential input terminals IA/IB to the predetermined voltage (for example, VDD of FIG. 1 and 0V of FIG. 2) during the pre-charging period. However, setting the differential input terminals IA/IB to the predetermined voltage by other methods can also achieve the same object. This embodiment discloses another method.

Figure 7A:
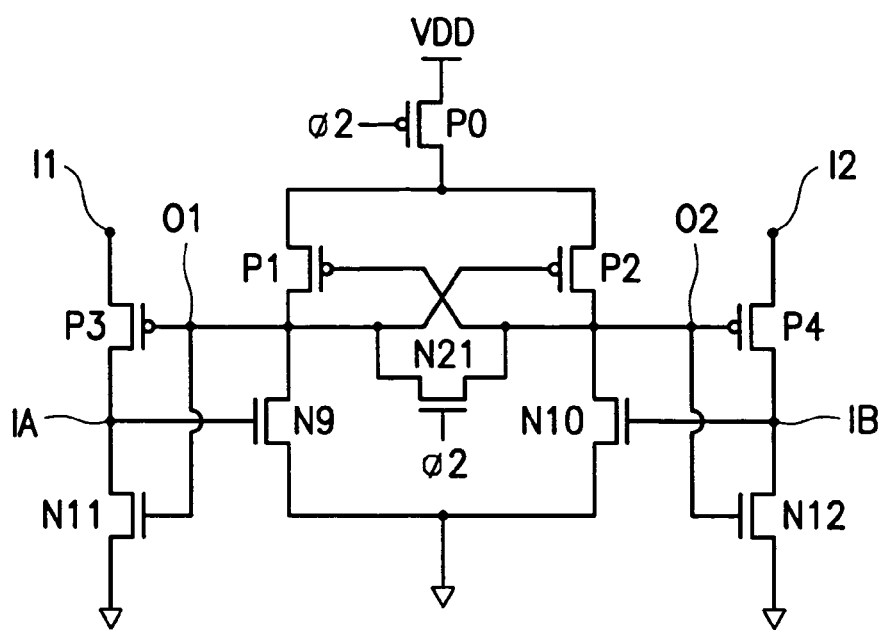
FIG. 7a illustrates a circuit diagram of the signal receiver in accordance with the second embodiment of the present invention.

FIG. 7a shows the circuit of the signal receiver of the second embodiment. FIG. 7a is basically the same as FIG. 1 of the first embodiment, so the same symbols are used for the corresponding elements and signals. The main difference lies in that the pre-charging transistors P5, P6 are removed, and the differential output terminals 01/02 of the positive feedback differential amplifier are coupled to NMOS transistor N21, wherein its gate is connected to control signal Ø2.

Figure 7B:
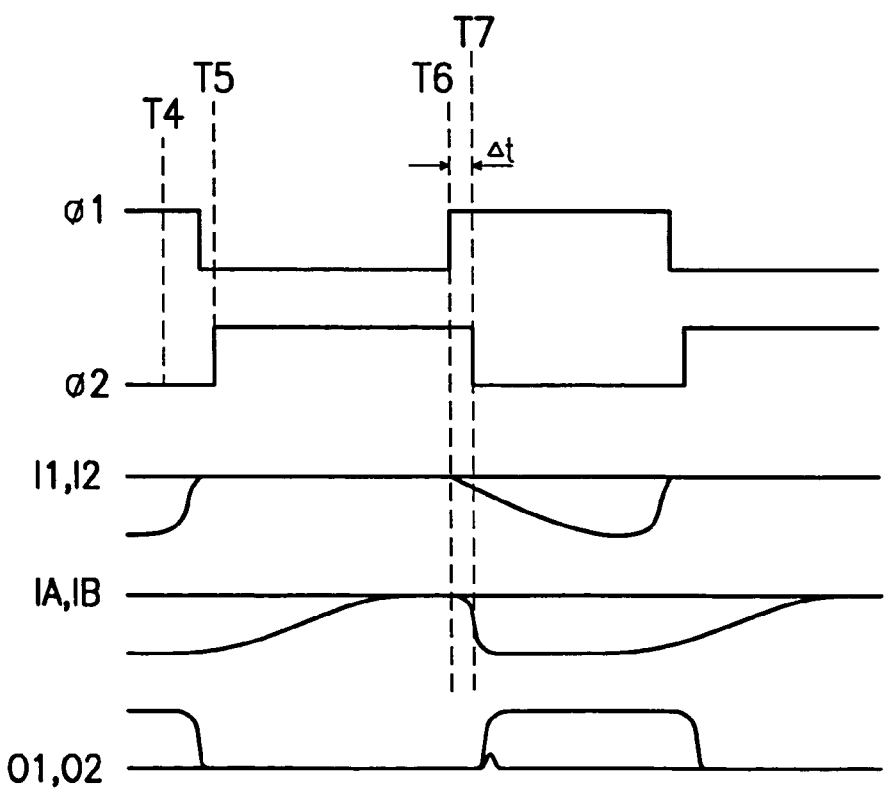

FIG. 7b shows the schematic diagram of the signal waveforms of the signal receiver of this embodiment, wherein the control signal Ø1 is used to control the pre-charge end time of the signal transmitter (i.e., the time start to send signal), so it is not shown in FIG. 7a; control signal Ø2 is used to control transistor P0 and transistor N21; I1/I2 represent the input terminals of the signal receiver; IA/IB represent the differential input terminals of the positive feedback differential amplifier; 01/02 represent the differential output terminals of the positive feedback differential amplifier. Next, the operation of the signal receiver in FIG. 7a is explained in detail in conjunction with FIG. 7b.

At time T4, control signal Ø2 is at logic "0", so the transistor P0 conducts and transistor N21 is turned off, i.e., the positive feedback differential amplifier (P0, P1, P2, N9, N10) starts to operate. According to the first embodiment, the positive feedback differential amplifier is at the evaluation stage and will make one of the differential output pairs 01/02 logic "1" (VDD) and the other logic "0" (0V). In the following description, assume the differential output terminal 01 is at logic "1" and the differential output terminal 02 is at logic "0", though it is understood that the following operational mode can achieved under other conditions. When 01 is "1" and 02 is "0", transistor P3 is turned off and transistor N11 is turned on, so the differential input terminal IA is at logic "0" and transistor N9 is turned off; in addition, the transistor P4 is turned on and transistor N12 is turned off, so the differential input terminal IB is at logic "1" and transistor N10 is turned on.

At time T5, when the control signal Ø2 changes from 0 to 1, transistor P0 is turned off and transistor N21 is turned on, i.e., the positive feedback amplifier does not operate. At this time, conducting transistor N21 and transistor N10 can construct a discharging path for differential output terminal 01, i.e., the output terminal 01 is discharged from logic "1" to logic "0". Next, transistor P3 will be turned on and transistor N11 will be turned off. At the same time, since the control signal 1 is "0", the signal transmitter will send out logic "1" to input terminals I1/I2, while the differential input terminals are raised to logic "1" to complete the pre-charging operation.

As in the first embodiment, at time T6 and T7, the signal transmitter starts to send signals and the signal receiver starts to evaluate. After the positive feedback differential amplifier is turned on, the evaluating operation can soon be completed. By repeating the above operations, the process of the invention can be continued.

The pre-charging operation in this embodiment mainly uses the pre-charging voltage sent out by the signal transmitter. In other words, in the pre-charging period, the differential input terminals 01/02 are pulled to 0V, so as to make the transistors P3 and P4 between input terminals I1/I2 and differential input terminals IA/IB conduct, thereby charging them to VDD. It is understood, however, that various methods can be used to achieve the object of pre-charging without departing from the scope of the invention. It should also be noted that if the transistor N21 is comprised of a PMOS transistor, this embodiment can also be applied to the signal receiver shown in FIG. 2.

THIRD EMBODIMENT

The first embodiment mainly uses transistor P3 and P4 to isolate input terminals I1/I2 and differential input terminals IA/IB. This embodiment discloses another approach to this object.

Figure 8A:
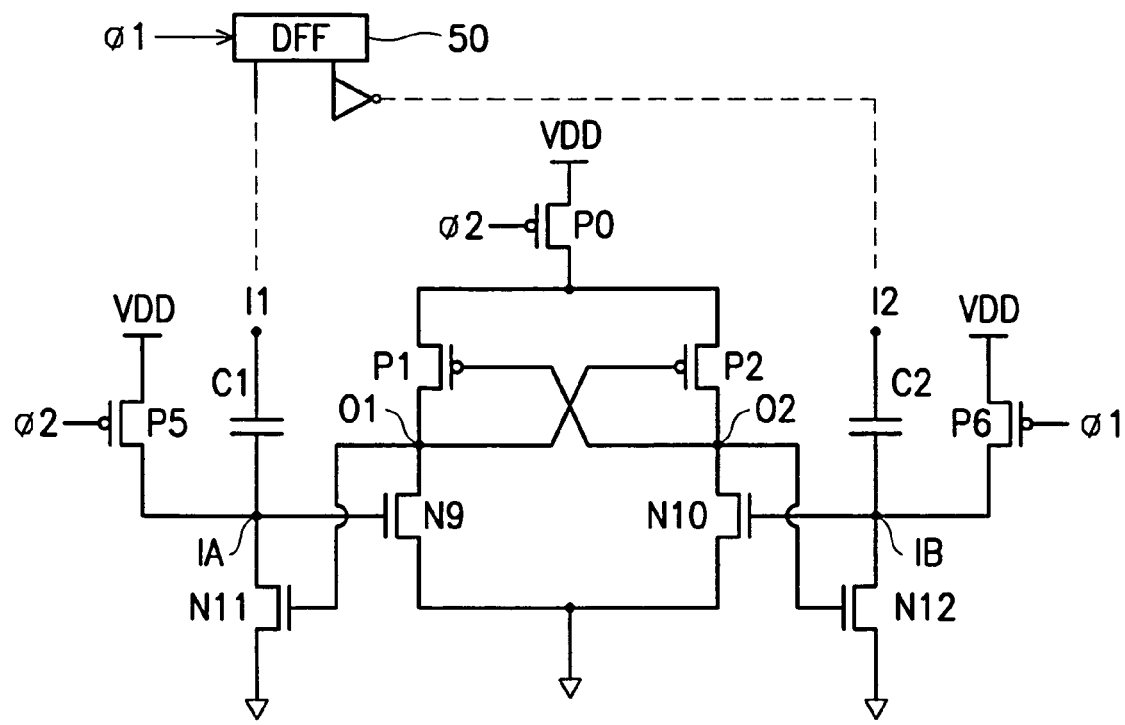
FIG. 8a illustrates a circuit diagram of the signal receiver in accordance with the third embodiment of the present invention.

FIG. 8a shows the circuit diagram of the signal transmission structure according to the third embodiment of the present invention. FIG. 8a is essentially the same as the FIG. 1 of the first embodiment, so the same symbols are used for corresponding elements and signals. The main difference is in that capacitors C1 and C2 are used here instead of the transistor P3 and P4 of the coupling circuit used in FIG. 1. The input terminal I1 and I2 come directly from the complementary signals generated by the static circuit. The capacitors C1 and C2 can couple complementary signals on the input terminal I1 and I2 to the differential input terminal IA and IB. On the other hand, capacitors C1 and C2 can isolate input terminals I1/I2 and differential input terminals IA/IB, thereby not only cutting off the DC current but also reducing the load of the differential input terminals IA/IB. Thus, the voltage of the differential input terminals IA/IB can be quickly pulled down when the positive feedback operates.

Figure 8B:
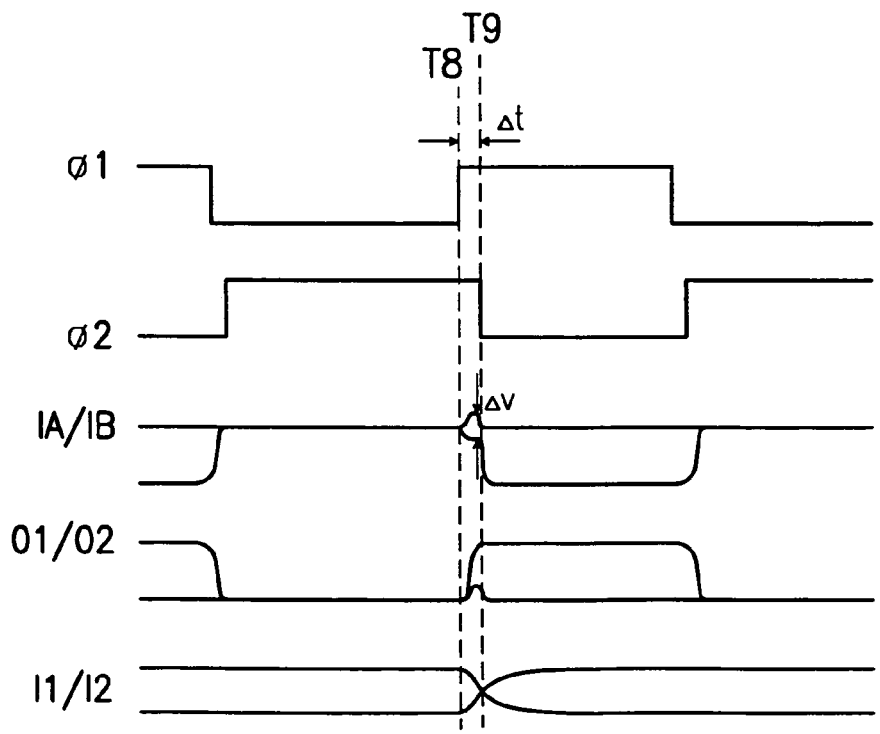

FIG. 8b shows the schematic diagram of signal waveforms of the signal transmission structure of this embodiment, wherein the control signal Ø1 is used to control the starting time to transmit signals in the signal transmitter and the pre-charging time of transistors P5, P6 in the signal receiver; control signal 2 is used to control the transistor P0; and I1/I2 represent the input terminals of the signal receiver. It should be noted that the input terminals I1/I2 in this embodiment are not pre-charged to VDD; IA/IB represent the differential input terminals of the positive feedback differential amplifier; and 01/02 represent the differential output terminals of the positive feedback differential amplifier.

Basically, the operation of this embodiment is the same as that of the first embodiment; however, the capacitors C1 and C2 are used to connect the input terminals I1 and I2 in this embodiment, so the input terminals I1/I2 are not pre-charged to the pre-charge voltage and receive differential signals directly. Therefore, before the positive feedback differential amplifier starts to operate (i.e., control signal Ø2 is "0"), the signal change on the input terminals I1/I2 is coupled to differential input terminals IA/IB through the capacitors C1/C2, and enough voltage difference is generated on the differential input terminals IA/IB. Control signal Ø1 is used to control the timing of the signal transmitting from the signal transmitting end to positively trigger the D type flip-flop 50 of the control output differential signal. In FIG. 8b, at time T8, when control signal 01 changes from "0" to "1", the flip-flop 50 of signal transmitter will send the differential signal to be transmitted to the transmission line, and will be coupled to the differential input terminals IA/IB via the capacitors C1 and C2. At time t9, when the control signal Ø2 becomes "0", the positive feedback differential amplifier starts to evaluate. At this point, there is enough voltage difference on the differential input terminals IA/IB to allow the positive feedback differential amplifier to complete the evaluation quickly and output it to the differential output terminals 01/02, and the voltage on the differential input terminals IA/IB will be pulled to the corresponding voltage value quickly.

The value of the coupled capacitance of the capacitor C1/C2 used in this embodiment needs to be considered when coupling the signal on the input terminals I1/I2. Enough voltage difference must be generated on the differential input terminals IA/IB to allow the signal receiver to operate normally, while the problem of unmatchedness of elements resulting from the change of manufacturing process must be considered. In fact, the length of the time interval Δt and the differential signal changing rate of the input terminals 11/12 also affects the size of voltage difference ΔV. Overall, since the parasitic capacitance on the differential input terminals IA/IB is small, and the characteristic of the sense amplifier is good, the values of the capacitance C1 and C2 are very small. For general CMOS manufacturing, the smallest sized MOS capacitor can produce a very large voltage difference. Even the parasitic capacitance of the metal connecting layer-polysilicon or metal connecting layer-metal connecting layer is used, the required area is small. Therefore, it is easy to produce the required capacitors C1 and C2 in the standard digital CMOS manufacturing process. However, it should be noted that the coupling effect of capacitors C1 and C2 is only for input terminals I1 and I2, so other signal and parasitic effects corresponding to the coupling of capacitors C1 and C2 should be minimized.

In this embodiment, the input terminals I1/I2 and differential input terminals IA/IB are isolated using capacitors to achieve the differential signal coupling effect. However, to the skilled in the art, different methods can also be used to achieve the isolating/coupling effect without departing from the scope of the invention. Finally, this embodiment can also apply to the signal receiver shown in FIG. 2 by replacing the transistors N3 and N4 with capacitors.

FOURTH EMBODIMENT

In the above embodiments, signals to be transmitted generate differential signals in the signal transmitter and are then sent to the signal receiver by two transmission lines. Actually, a single transmission line can be used to transmit independent input signals. This embodiment discloses one way to handle this.

Figure 9A:
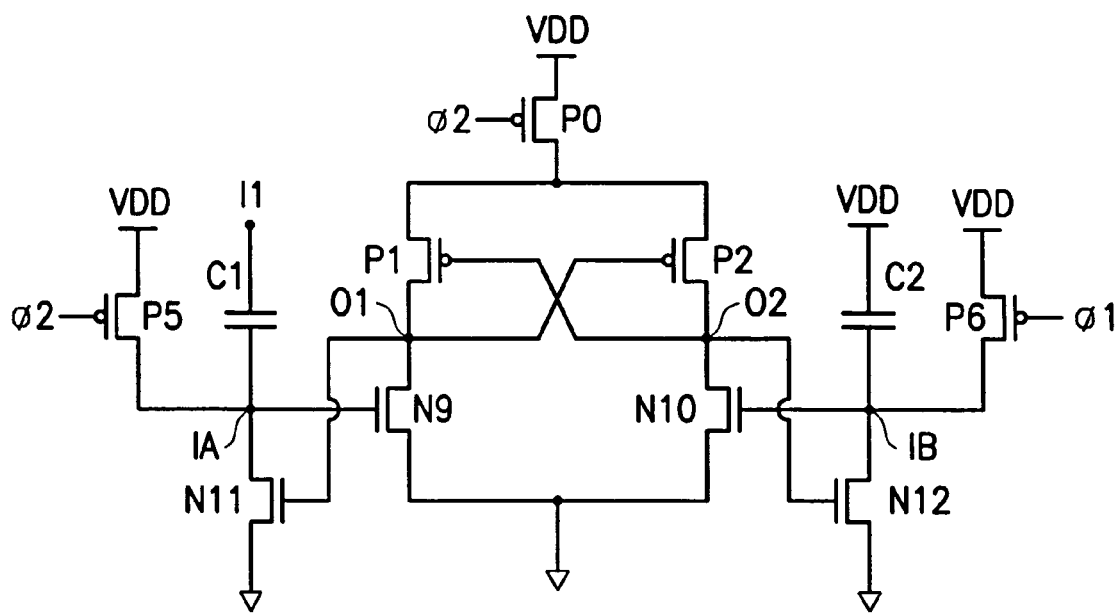
FIG. 9a illustrates a circuit diagram of the signal receiver in accordance with the fourth embodiment of the present invention.

FIG. 9a shows the circuit diagram of the signal transmitting structure according to the fourth embodiment of the present invention. This embodiment is modified from FIG. 8a of the third embodiment, but the same principle can be applied to the first and the second embodiments. FIG. 9a differs from FIG. 8a in that the independent input signal enters the signal receiver through the input terminal I1, and the original input terminal I2 is fixedly connected to VDD. Capacitor C1 is used to couple the independent input signal to the differential input terminal IA, and the capacitor C2 is used to balance the load.

Figure 9B:
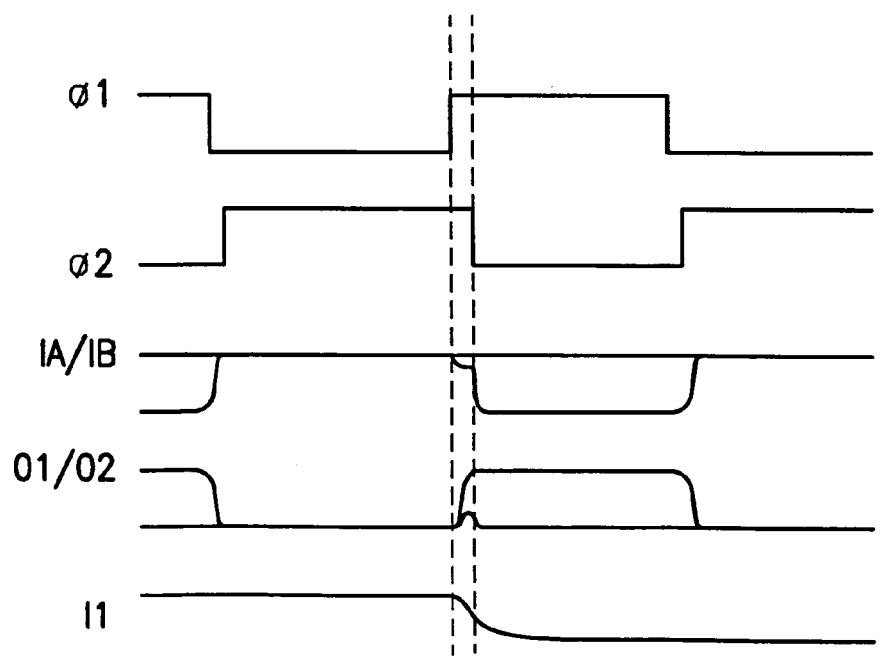

FIG. 9b shows the schematic diagram of the signal waveforms of the transmitting structure of this embodiment. Here, the independent input signal enters and couples to the differential input terminal IA via the input terminal I1, unlike the third embodiment, both differential input terminals IA and IB have a coupling voltage. Therefore, to generate a sufficient enough voltage difference between input terminals IA and IB, it is necessary to increase the capacitance values of capacitors C1 and C2 or to elongate Δt. Other operations are the same as the third embodiment, so they will not be described here.

This embodiment uses a single input terminal I1 to couple the independent input signal. Other operations basically are the same as that of the above embodiments, so this embodiment can be applied to the first and third embodiment.

FIFTH EMBODIMENT

In the first embodiment, a dynamic circuit and static circuit are used to implement the signal transmitter that can be applied to the first and second embodiment. As mentioned above, this signal transmitter pre-charges the transmission line during the pre-charging period to allow the input terminals I1/I2 connected go to a predetermined voltage, for example VDD or 0V, and then sends the transmitting differential signal to the transmission line. Furthermore, since the transmission distance is long, the changing rate of the transmitting differential signal is slow. Evaluation starts at a time which is a period after the signal starts transmitting (i.e., Δt), i.e., using the positive feedback differential amplifying operation to amplify the small voltage difference ΔV to become a normal logic level. Thus, the signal transmitter in the present invention does not need to send the complete differential signal to the transmission line. The signal receiver only needs to make the voltage difference ΔV on the differential input terminals IA/IB in time Δt sufficiently large to make the positive feedback differential amplifier recover to normal logic. This reduces the power consumption when the signal transmitter transmits the signal. This embodiment discloses a self-isolated signal transmitter with this function.

Figure 10A:
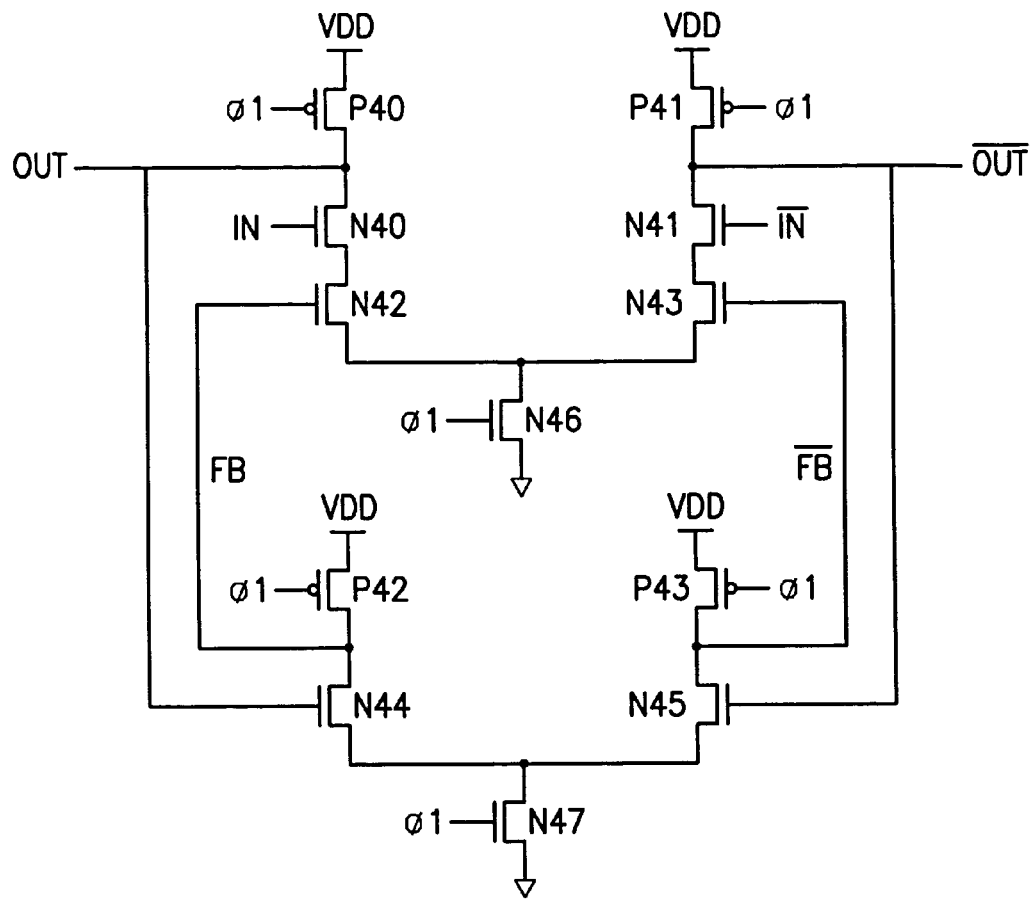
FIG. 10a illustrates a diagram of the structure of the self-isolated signal transmitter constructed by dynamic circuitry in accordance with the fifth embodiment of the present invention.

FIG. 10a shows the schematic diagram of the circuit of the self-isolated signal transmitting structure constructed by the dynamic circuit according to this embodiment. In FIG. 10a, transistor P42, P43 and transistor N44, N45, N47 comprise a first differential circuit, wherein the transistor N47 is controlled by the control signal Ø1, two differential input pairs of the first differential circuit (gates of transistors P42/P43 and gates of transistors N44/N45) are connected to the control signal Ø1 and output terminals OUT/OUT. The output terminal of the first differential circuit is feedback signal FB/FB. In addition, transistors P40, P41 and transistors N40, N41, N42, N43, N46 comprise the second differential circuit, wherein the transistor N46 is controlled by the control signal Ø1, and the three differential input terminal pairs (gates of transistors P40/P41, gates of transistors N40/N41, gates of transistors N42/N43) are connected to control signal Ø1, input data IN/IN and feedback signal FB/FB, respectively. The output signal of the second differential circuit is connected to the output terminal OUT/OUT.

Figure 10B:
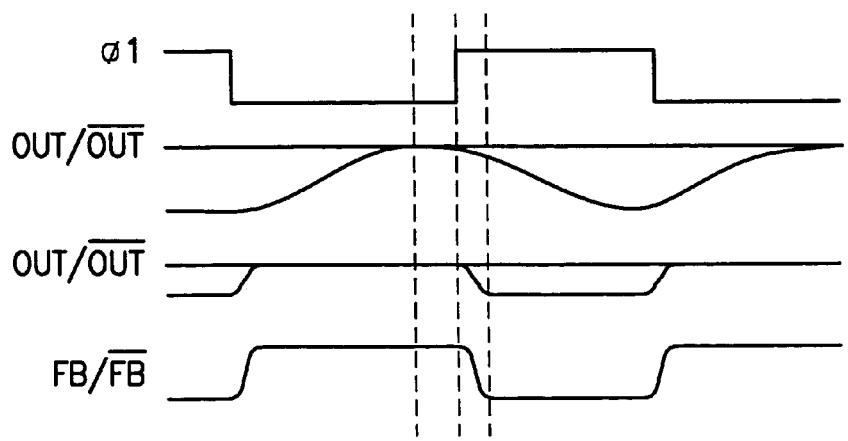

FIG. 10b shows the schematic diagram of signal waveforms of the dynamic circuit self-isolated signal transmitter of FIG. 10a, and provides the signal waveforms of the transmitting differential signal on the output terminals OUT/OUT of the prior art for comparison. At time T10, when the control signal 1 is "0", two differential circuit do not operate; however, since the transistor P40 and P41 conduct, the transmission line (i.e., signal receiving end) will be pre-charged to logic "1" through the output terminal OUT/OUT. Because the transistor P42 and P43 are turned on, feedback signal FB/FBrises back to logic "1"; therefore, transistors N42, N43, N44 and N45 conduct. At time T11, the control signal Ø1 becomes "1", two differential circuits start to operate. The voltage difference between input data IN/IN soon appears on output terminals OUT/OUT one of the two falling down to 0V (the initial voltage is VDD). However, the output of the ouput terminals OUT/OUT will be sent to the transistors N44 and N45 of the first differential circuit, the feedback voltage FB/FB quickly falls down to 0V (the initial voltage is VDD) because the load is small, and feeds back to the gates of transistors N42/N43 of the second differential circuit, turning off the transistors N42 and N43 simultaneously, and cutting off the discharging path on the output terminal OUT/OUT with the decreasing voltage. Therefore the voltage difference on the output terminal OUT/OUT is small, achieving the object of self-isolation.

Figure 11A:
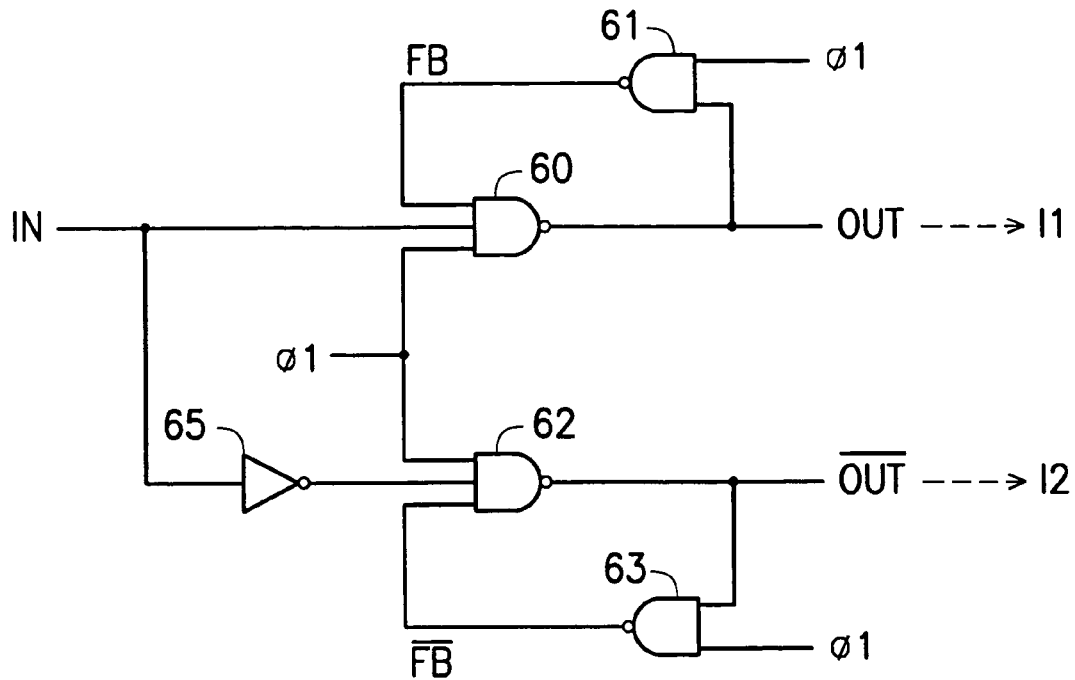
FIG. 11a illustrates a diagram of the structure of the self-isolated signal transmitter constructed by static circuitry in accordance with the fifth embodiment of the present invention.

Instead of using a dynamic circuit to implement the self-isolated signal transmitter, a static circuit can be used. FIG. 11a shows the schematic diagram of the circuit of the self-isolated signal transmitting structure constructed by a static circuit. As shown in the diagram, the self-isolated signal transmitter mainly includes NAND gates 60, 61, 62 and 63, wherein NAND gates 60, 62 are three input logic gates, and NAND gates 61, 63 are two input logic gates. In addition, inverter 64 is used to generate inverting data IN of input data IN.

The input terminal of NAND gate 60 is connected to feedback signal FB, input data IN and control signal 01, while the output terminal is connected to OUT; the input terminal of NAND gate 62 is connected to the feedback signal FB, input data IN and control signal Ø1, while its output terminal is connected to OUT; the input terminal of NAND gate 61 is connected to the control signal Ø1 and output terminal OUT, while its output terminal outputs the feedback signal FB; and the input terminal of NAND gate 63 is connected to the control signal Ø1 and output terminal OUT, while its output terminal outputs feedback signal FB.

Figure 11B:
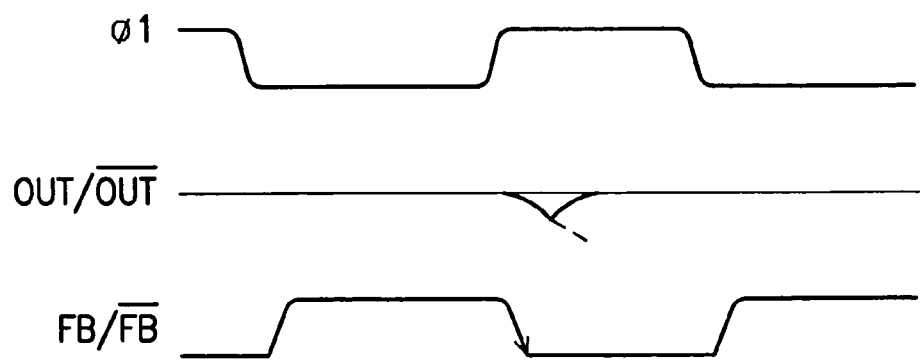

FIG. 11b shows the schematic diagram of the signal waveforms of the static circuit self-isolated signal transmitting structure of FIG. 11a. The operation is described in detail in conjunction with FIG. 11b. When the control signal Ø1 is "0", NAND gates 60 and 62 output "1", thereby pre-charging the input terminals I1/I2 of the signal receiver via the transmission line. At this time, the feedback signals FB/FB are set at "1". When the control signal Ø1 changes from "0" to "1", the NAND gates 60 and 62 are like inverters (because the control signal Ø1 and feedback signals FB/FB are "1"), so the input data IN generates a differential signal and sends it to the output terminals OUT/OUT. Thus, the voltage on one of the output terminals OUT/OUT falls down. On the other hand, the logic value on the output terminals OUT/OUT will be sent to the input terminal of NAND gates 61 and 63. When the voltage value on the output terminals OUT/OUT is changed to a degree that it is possible to identify the logic value, the feedback signals FB/FB change accordingly, so after feeding back to the NAND gates 60 and 62, the voltage going down is pulled back, achieving the object of self-isolation.

The greatest advantage of the self-isolated signal transmitter of this embodiment is that it does not need to transmit the differential signal of full amplitude to the transmission line. After a predetermined time period, the transmitting path of the differential signal pair to the transmission line is equivalently cut off. This characteristic corresponds to the signal receiver of the present invention: it only needs to detect a local voltage difference to quickly recover to a signal with the normal logic level. Therefore, the power consumption in the transmitting process is reduced in the signal transmitter, attaining the object of reducing the power.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A signal receiver for receiving a differential input signal pair through an external differential input terminal pair, comprising:

a positive feedback differential amplifier having a differential input terminal pair and a differential output terminal pair;

a coupling circuit, coupled to the external differential input terminal pair, the differential input terminal pair and the differential output terminal pair, for coupling the differential input signal pair on the external differential input terminal pair to the differential input terminal pair; and a pre-charger for pre-charging the differential input terminal pair to a predetermined voltage level;

wherein the differential input terminal pair is coupled to the external differential input terminal pair before a first time point, the differential input signal pair enters into the differential input terminal pair of the positive feedback differential amplifier via the coupling circuit after the first time point, and the positive feedback differential amplifier is activated to amplify the entered differential input signal pair and outputs to the differential output terminal pair at a second time point a predetermined period after the first time point.

2. The signal receiver as claimed in claim 1, wherein the coupling circuit includes a first coupling circuit and a second coupling circuit, the first coupling circuit comprising:
   a first transistor; and
   a second transistor, wherein the gates of the first transistor and the second transistor are coupled to a first terminal of the differential output terminal pair, sources of the first transistor and the second transistor are coupled to a first terminal of the differential input terminal pair, and a drain of the first transistor serves as a first terminal of the external differential input terminal pair; and
   the second coupling circuit comprising:
   a third transistor; and
   a fourth transistor, wherein gates of the third transistor and the fourth transistor are coupled together to a second terminal of the differential output terminal pair, sources of the third transistor and fourth transistor are coupled together to a second terminal of the differential input pair, and a drain of the third transistor serves as a second terminal of the external differential input terminal pair.

3. The signal receiver as claimed in claim 2, wherein the first and the third transistors are PMOS transistors, the second and fourth transistors are NMOS transistors, and drains of the second transistor and the fourth transistor are connected to ground.

4. The signal receiver as claimed in claim 2, wherein the first and third transistors are PMOS transistors, the second and fourth transistors are NMOS transistors, and drains of the second transistor and the fourth transistor are connected to a high voltage.

5. The signal receiver as claimed in claim 1, wherein the coupling circuit includes a first coupling circuit and a second coupling circuit, the first coupling circuit comprising:
   a first capacitor having a first end coupled to a first terminal of the external differential input terminal pair; and
   a first transistor having a gate connected to a first terminal of the differential output terminal pair, and a drain connected to a second end of the first capacitor and a first terminal of the differential input terminal pair;
   and the second coupling circuit comprising:
   a second capacitor having a first end coupled to a second terminal of the external differential input terminal pair; and
   a second transistor having a gate connected to a second terminal of the differential output terminal pair, and a drain connected to a second end of the second capacitor and a second terminal of the differential input terminal pair.

6. The signal receiver as claimed in claim 5, wherein the first transistor and the second transistor are NMOS transistors having sources connected to ground.

7. The signal receiver as claimed in claim 5, wherein the first transistor and the second transistor are PMOS transistors, having their sources connected to a high voltage.

8. The signal receiver as claimed in claim 1, wherein the pre-charger comprises:
   a first local control transistor having a gate connected to a first control signal for pre-charging a first terminal of the differential input terminal pair to the predetermined voltage level before the first time point, the first local control transistor being turned off after the first time point; and
   a second local control transistor having a gate connected to the first control signal for pre-charging a second terminal of the differential input terminal pair to the predetermined voltage level before the first time point, the second local control transistor being turned off after the first time point;
   wherein the external differential input terminal pair are pre-charged to the predetermined voltage level before the first time point and the positive feedback differential amplifier is controlled with a second control signal for defining the second time point.

9. The signal receiver as claimed in claim 1, wherein the pre-charger comprises:
   a local control transistor having a gate connected to a control signal, and a source and a drain connected to the differential output terminal pair, the control signal is used for defining the second time point.

10. A signal receiver for receiving an independent input signal via an external input terminal, comprising:
    a positive feedback differential amplifier having a differential input terminal pair and a differential output terminal pair;
    a coupling circuit, coupled to the external input terminal, the differential input terminal pair and the differential output terminal pair, for coupling the independent input signal on the external input terminal to the differential input terminal pair; and
    a pre-charger for pre-charging the differential input terminal pair to a predetermined voltage level;
    wherein the differential input terminal pair is coupled to the external input terminal before a first time point, wherein the independent input signal enters the differential input terminal pair of the positive feedback differential amplifier via the coupling circuit after the first time point, and the positive feedback differential amplifier is activated to amplify the entered independent input signal and outputs to the differential output terminal pair at a second time point a predetermined period after the first time point.

11. The signal receiver as claimed in claim 10, wherein the coupling circuit includes a first coupling circuit and a second coupling circuit, the first coupling circuit comprising:
    a first capacitor having a first end coupled to the external input terminal; and
    a first transistor having a gate connected to a first terminal of the differential output terminal pair, and a drain connected to a second end of the first capacitor and a first terminal of the differential input terminal pair;
    and the second coupling circuit comprising:
    a second capacitor having a first end connected to a fixed voltage level; and
    a second transistor having a gate connected to a second terminal of the differential output terminal pair, and a drain connected to a second end of the second capacitor and a second terminal of the differential input terminal pair.

12. The signal receiver as claimed in claim 11, wherein the first transistor and the second transistor are NMOS transistors having sources connected to ground.

13. The signal receiver as claimed in claim 11, wherein the first transistor and the second transistor are PMOS transistors having sources connected to a high voltage.

14. The signal receiver as claimed in claim 10, wherein the pre-charger comprises:
- a first local control transistor having a gate connected to a first control signal for pre-charging a first terminal of the differential input terminal pair to the predetermined voltage level before the first time point, the first local control transistor being turned off after the first time point; and
- a second local control transistor having a gate connected to the first control signal for pre-charging a second terminal of the differential input terminal pair to the predetermined voltage level before the first time point, the second local control transistor being turned off after the first time point;
- wherein the external input terminal is pre-charged to the predetermined voltage level via the coupling circuit before the first time point and the positive feedback differential amplifier is controlled with a second control signal for defining the second time point.

15. A signal transmitter for transmitting a differential input signal pair to a transmission line, comprising:
- an external differential output terminal connecting to the transmission line; and
- a control circuit, controlled by a first control signal for defining a first time point, for pre-charging the transmission line to a predetermined voltage level via the external differential output terminal before the first time point, and transmitting the differential input signal pair to the transmission line after the first time point, wherein the control circuit includes:
- a first logic gate having an input terminal pair coupled to the first control signal and a first signal of the differential input signal pair, and an output terminal coupled to a first terminal of the external differential output terminal, for pre-charging a first path of the transmission line to the predetermined voltage level via the first terminal of the external differential output terminal before the first time point, and substantially transmitting the first signal of the differential input signal pair to the first path of the transmission line after the first time point; and
- a second logic gate having an input terminal pair coupled to the first control signal and a second signal of the differential input signal pair, and an output terminal coupled to a second terminal of the external differential output terminal, for pre-charging a second path of the transmission line to the predetermined voltage level via the second terminal of the external differential output terminal before the first time point, and substantially transmitting the second signal of the differential input signal pair to the second path of the transmission line after the first time point.

16. The signal transmitter as claimed in claim 15, wherein the control circuit is a differential circuit coupled to the external differential output terminal and controlled by the first control signal, wherein the differential circuit has a dynamic load controlled by the first control signal for pre-charging the transmission line to the predetermined voltage level.

17. The signal transmitter as claimed in claim 15, wherein the control circuit is a differential circuit coupled to the external differential output terminal and controlled by the first control signal, wherein the differential circuit has a fixed load for pre-charging the transmission line to the predetermined voltage level.

18. The signal transmitter as claimed in claim 15, wherein the first logic gate and the second logic gate are NAND gates.

19. The signal transmitter as claimed in claim 15, wherein the first logic gate and the second logic gate are NOR gates.

20. A signal transmitter for transmitting a differential input signal pair to a transmission line, comprising:
- an external differential output terminal connecting to the transmission line; and a
- control circuit, controlled by a first control signal for defining a first time point for pre-charging the transmission line to a predetermined voltage level via the external differential output terminal before the first time point, and transmitting the differential input signal pair to the transmission line after the first time point, wherein the control circuit includes:
- a first differential circuit having an input terminal pair connected to the first control signal and the external differential output terminal, and an output terminal pair for outputting a feedback signal pair; and
- a second differential circuit having an input terminal pair connected to the first control signal, the differential input signal pair and feedback signal pair, and an output terminal pair connected to the external differential input terminal;
- wherein the control circuit substantially cuts off the interconnection between the differential input signal pair and the transmission line within a predetermined period after the first time point.

21. A signal transmitter for transmitting a differential input signal pair to a transmission line, comprising:
- an external differential output terminal connecting to the transmission line; and a
- control circuit, controlled by a first control signal for defining a first time point for pre-charging the transmission line to a predetermined voltage level via the external differential output terminal before the first time point, and transmitting the differential input signal pair to the transmission line after the first time point,
- wherein the control circuit comprises:
- a first logic gate having an input terminal connected to the first control signal, a first signal of the differential input signal pair and a first feedback signal, and an output terminal connected to a first terminal of the external differential output terminal;
- a second logic gate having an input terminal connected to the first control signal, a second signal of the differential input signal pair and a second feedback signal, and an output terminal connected to a second terminal of the external differential output terminal;
- a third logic gate having an input terminal connected to the first control signal and the first terminal of the external differential output terminal, and an output terminal for outputting the first feedback signal; and
- a fourth logic gate having an input terminal connected to the first control signal and the second terminal of the external differential output terminal, and an output terminal for outputting the second feedback signal;
- wherein the control circuit substantially cuts off the interconnection between the differential input signal pair and the transmission line within a predetermined period after the first time point.

22. The signal transmitter as claimed in claim 21, wherein the first logic gate, the second logic gate, the third logic gate and the fourth logic gate are NAND gates.

23. A signal transmission system, mounted into a chip and having a signal transmitter and a signal receiver connected with each other by a transmission line, wherein the signal transmitter transmits a differential input signal pair to the transmission line via an external differential output terminal pair and the signal receiver receives the differential input signal pair via the external differential input terminal pair, the signal transmitter comprising:

a control circuit, controlled by a first control signal for defining a first time point for pre-charging the transmission line to a predetermined voltage level via the external differential output terminal pair before the first time point, and substantially transmitting the differential input signal pair to the transmission line after the first time point;

and the signal receiver comprising:

a positive feedback differential amplifier having a differential input terminal pair and a differential output terminal pair;

a coupling circuit, coupled to the external differential input terminal pair, the differential input terminal pair and the differential output terminal pair, for coupling the differential input signal pair on the external differential input terminal pair to the differential input terminal pair; and a pre-charger for pre-charging the differential input terminal pair to the predetermined voltage level;

wherein the differential input terminal pair is coupled to the external differential input terminal pair before the first time point, wherein the differential input signal pair enters the differential input terminal pair of the positive feedback differential amplifier via the coupling circuit after the first time point, and the positive feedback differential amplifier is activated to amplify the entered differential input signal pair and outputs to the differential output terminal pair at the second time point a predetermined period after the first time point.

24. The signal transmission system as claimed in claim 23, wherein the control circuit substantially cuts off the interconnection between the differential input signal pair and the transmission line within a predetermined period after the first time point.

* * * * *